(12) United States Patent
Prentice et al.

(10) Patent No.: US 6,214,117 B1
(45) Date of Patent: Apr. 10, 2001

(54) DISPENSING SYSTEM AND METHOD

(75) Inventors: Thomas C. Prentice, Westford, MA (US); Brian P. Prescott, Fremont, NH (US); Kenneth C. Crouch, N. Andover, MA (US); Murray D. Scott, Hudson, NH (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 09/253,119

(22) Filed: Feb. 19, 1999

Related U.S. Application Data

(63) Continuation-in-part of application No. 09/033,022, filed on Mar. 2, 1998, now Pat. No. 6,007,631, and application No. 09/189,014, filed on Nov. 9, 1998.

(51) Int. Cl.[7] .................................................. B05C 11/00
(52) U.S. Cl. ........................... 118/669; 118/668; 118/314
(58) Field of Search ..................... 118/668, 669, 118/695, 313, 314, 315, 323, 324; 222/129, 132, 144.5

(56) References Cited

U.S. PATENT DOCUMENTS

| 4,176,455 | 12/1979 | Copeland et al. ......................... 33/1 |
| 4,835,710 | 5/1989 | Schnelle et al. ..................... 364/513 |
| 4,838,515 | 6/1989 | Prentice ................................ 248/661 |
| 4,979,093 | 12/1990 | Laine et al. ..................... 364/167.01 |
| 5,092,021 | 3/1992 | Buzzi ....................................... 29/38 |
| 5,097,577 | 3/1992 | Buzzi et al. .............................. 29/38 |
| 5,213,559 | 5/1993 | Lunazzi ................................. 483/14 |
| 5,378,282 | 1/1995 | Pollard ................................. 118/697 |
| 5,486,151 | 1/1996 | Bergmann et al . ..................... 483/1 |

(List continued on next page.)

FOREIGN PATENT DOCUMENTS

| 667 631 A5 | 10/1988 | (CH) . |
| 42 34 675 | 4/1993 | (DE) . |
| 0 278 457 | 8/1988 | (EP) . |
| 0 508 130 | 10/1992 | (EP) . |
| 0 700 733 | 3/1996 | (EP) . |
| 2 621 715 | 4/1989 | (FR) . |
| 2 398 937 | 2/1997 | (FR) . |
| 2 292 598 | 2/1996 | (GB) . |

OTHER PUBLICATIONS

\*Ing, et al. "The Hexapod Principle" Laboratory for Machine Tools and Production Engineering at Aachen University of Technology,.

\*Hexal Corporation brochure "Hexel's Hexapod Solutions".

\*Cooke, Arthur, et al. Advanced reconfigurable machine for flexible fabrication. 1995 North AmericanConference on Smart Structures and Materials, San Diego, CA, Feb. 26–Mar. 3, 1996.

(List continued on next page.)

Primary Examiner—James Sells
(74) Attorney, Agent, or Firm—Mintz, Levin, Cohn, Ferris, Glovsky and Popeo, P.C.

(57) ABSTRACT

A dispensing system and method for dispensing material onto a substrate. The dispensing system includes a frame, a support, coupled to the frame, that supports the substrate at a dispensing position in the dispensing system, and a dispensing head, coupled to the frame, that dispenses the material onto the substrate. The dispensing head includes a motor unit having a first motor coupled to an output drive mechanism, and a dispensing unit, removably coupled to the motor unit, having a material outlet from which the dispensing material is dispensed, the dispensing unit having a dispensing mechanism coupled to the material outlet and coupled to the output drive mechanism of the motor unit such that operation of the first motor causes the dispensing mechanism to dispense material through the outlet.

26 Claims, 11 Drawing Sheets

U.S. PATENT DOCUMENTS

| | | | |
|---|---|---|---|
| 5,795,390 | * 8/1998 | Cavallaro | 118/314 |
| 5,807,044 | 9/1998 | Watari et al. | 409/183 |
| 5,886,494 | 3/1999 | Prentice et al. | 318/625 |
| 5,903,125 | 5/1999 | Prentice et al. | 318/625 |
| 5,957,343 | * 9/1999 | Cavallaro | 222/504 |
| 6,007,631 | * 12/1999 | Prentice et al. | 118/669 |
| 6,093,251 | * 7/2000 | Carr et al. | 118/712 |

OTHER PUBLICATIONS

*Patent Abstracts of Japan vol. 97, No. 3, Mar. 31, 1997 & JP 08 298394 A (Tescon KK), Nov. 12, 1996.
*Patent Abstracts of Japan, vol. 17, No. 434 (E–1412), Aug. 11, 1993 & JP 05 090799 A (TDK Corp), Apr. 9, 1993.
*International Search Report dated Apr. 19, 1999.

* cited by examiner

DISPENSING SYSTEM AND METHOD

RELATED APPLICATIONS

This application is a continuation in part of U.S. patent applications Ser. No. 09/033,022, filed Mar. 02, 1998 U.S. Pat. No. 6,007,631 and Ser. No. 09/189,014 filed Nov. 09, 1998 both of which are incorporated herein by reference.

FIELD OF THE INVENTION

The present invention relates generally to an apparatus and method for performing a plurality of work operations in parallel using a plurality of work devices within one workstation. More specifically, the present invention relates to an apparatus and method for dispensing material onto a substrate using one or more dispensing heads in a dispensing system.

BACKGROUND OF THE INVENTION

There are several types of prior art dispensing systems used for dispensing metered amounts of liquid or paste for a variety of applications. One such application is in the assembly of printed circuit boards and integrated circuit chips. In this application, dispensing systems are used in the process of encapsulating integrated circuits with an encapsulating material and in the process of underfilling flip integrated circuit chips with an encapsulent. Prior art dispensing systems are also used for dispensing dots or balls of liquid epoxy or solder paste onto circuit boards and integrated circuits. The liquid epoxy and solder are used to secure components or connect components, respectively, to a circuit board or to an integrated circuit. The dispensing systems described above include those manufactured and distributed by Speedline Technologies, Inc, the assignee of the present invention, under the name CAMALOT™.

The dispensing systems described above are typically used in an electronics manufacturing facility in an automated assembly line with other equipment used in a circuit board or integrated circuit manufacturing process. The other equipment in-line with the dispensing systems may include, for example, pick and place machines, which place components on circuit boards, or reflow ovens that are used to heat materials, such as solder paste, dispensed onto the circuit boards or integrated circuits.

In a typical dispensing system, a pump and dispenser assembly is mounted to a moving assembly for moving the pump and dispenser assembly along three mutually orthogonal axes (x, y, z) using servomotors controlled by a computer system or controller. To dispense a dot of liquid on a circuit board at a desired location, the pump and dispenser assembly is moved along the horizontal x and y axes until it is located over the desired location. The pump and dispenser assembly is then lowered along the vertical z axis until the nozzle of the pump and dispenser assembly is at an appropriate dispensing height over the board. The pump and dispenser assembly dispenses a dot of liquid, is then raised along the z axis, moved along the x and y axes to a new location, and is lowered along the z axis to dispense the next liquid dot.

During the manufacture of circuit boards, it is sometimes necessary, or desirable, to dispense two different liquids or pastes onto a circuit board or to dispense different volumes of the same material. Dispensing systems have been designed that can dispense one of a number of dispensing materials from one dispensing head. One example of such a dispensing system is described in U.S. patent application Ser. No. 08/519,146, filed Aug. 24, 1995, U.S. Pat. No. 5,795,390 which is incorporated herein by reference. These dispensing systems typically are only able to dispense one material at a time, and the throughput of product in these systems may be less than desired because of the time required to dispense multiple materials serially using one dispensing head.

To overcome the throughput problem, two dispensing systems may be placed adjacent to each other with the first dispensing system dispensing one material and the second dispensing system dispensing a second material. This solution is expensive since two complete machines are used, and since additional manufacturing space is required. In typical operations, manufacturing floor space is limited, and it is desirable to limit the "footprint" of each manufacturing system on the manufacturing floor.

SUMMARY OF THE INVENTION

In one general aspect, the invention features a dispensing system for dispensing material onto a substrate. The dispensing system includes a frame, a support, coupled to the frame, that supports the substrate at a dispensing position in the dispensing system, and a dispensing head, coupled to the frame, that dispenses the material onto the substrate. The dispensing head includes a motor unit having a first motor coupled to an output drive mechanism and a dispensing unit, removably coupled to the motor unit, having a material outlet from which the dispensing material is dispensed. The dispensing unit has a dispensing mechanism coupled to the material outlet and coupled to the output drive mechanism of the motor unit such that operation of the first motor causes the dispensing mechanism to dispense material through the outlet.

The motor unit can include a second motor operatively coupled to a lift plate to provide vertical movement of the lift plate, and the dispensing unit can filter include an adapter that couples to the lift plate to provide vertical movement of the dispensing mechanism to lower the dispensing mechanism towards the substrate for dispensing.

The output drive mechanism can include a first gear and the dispensing mechanism can include a second gear disposed to engage the first gear. The first gear can have elongated teeth and the second gear can be constructed and arranged to move vertically when the dispensing mechanism is lowered while maintaining engagement with the elongated teeth of the first gear. The dispensing unit and the motor unit can be constructed and arranged to provide kinematic mating between the dispensing unit and the motor unit. The dispensing unit can include a plurality of electrical contacts, and the motor unit can include a plurality of electrical contacts for operatively coupling to the electrical contacts of the dispensing unit. The dispensing unit can include electrical identification circuitry coupled to the plurality of electrical contacts that provides identification of characteristics of the dispensing unit. The electrical identification circuitry can include a data storage element containing calibration data for the dispensing unit. The dispensing unit can include an inlet pneumatic port and the motor unit can include an output pneumatic port that mates with the inlet pneumatic port of the dispensing unit to provide pressurized air to the dispensing unit. The dispensing unit can include a syringe coupled to the dispensing mechanism to provide dispensing material to the dispensing mechanism, and the syringe can be constructed and arranged to move vertically when the dispensing mechanism is lowered. The dispensing system can be constructed and arranged such that the dispensing mechanism can be moved vertically over a range of movement, and such that over at least a portion of the range of movement, the syringe does not move with the dispensing mechanism. The motor unit can further include a second output drive mechanism and the dispensing unit can further include a second dispensing mechanism.

In another general aspect, the invention features a method of dispensing material onto a substrate using a dispensing system. The method includes steps of coupling a motor unit to the dispensing system, the motor unit having a motor with an output drive mechanism, coupling a dispensing unit to the motor unit such that a dispensing mechanism of the dispensing unit is operatively coupled to the output drive mechanism of the motor, and operating the motor to cause material to be dispensed onto the substrate from the dispensing mechanism.

The output drive mechanism can include a first gear and the dispensing mechanism can include a second gear, and the step of coupling the dispensing unit to the first motor unit can include engaging the second gear in the first gear. The method can further include a step of vertically moving the dispensing mechanism toward the substrate while maintaining the motor unit and the dispensing unit in a fixed position. The step of coupling the dispensing unit to the motor unit can provide a kinematic coupling between the motor unit and the dispensing unit. The step of coupling the dispensing unit to the motor unit can include a step of providing an electrical connection between the motor unit and the dispensing unit, and the method can further include a step of receiving data concerning characteristics of the dispensing unit over the electrical connection. The data received can include calibration information for the dispensing mechanism.

In another general aspect, the invention features a dispensing system for dispensing material onto a substrate. The dispensing system includes a frame, a support, coupled to the frame, that supports the substrate at a dispensing position in the dispensing system, and a dispensing head, coupled to the frame, that dispenses the material onto the substrate. The dispensing head includes a motor unit having a motor coupled to an output drive mechanism, a dispensing unit having a material outlet from which the material is dispensed, the dispensing unit having a dispensing mechanism coupled to the material outlet, and means for removably coupling the motor unit to the dispensing unit such that operation of the motor causes the dispensing mechanism to dispense material through the outlet.

The dispensing system can further include means for vertically moving the dispensing mechanism toward the substrate while maintaining the motor unit and the dispensing unit in a fixed position. The dispensing head can further include means for providing a kinematic coupling between the motor unit and the dispensing unit. The dispensing head can further include means for detecting characteristics of the dispensing unit. The means for detecting characteristics can include means for detecting calibration data of the dispensing unit.

BRIEF DESCRIPTION OF THE DRAWINGS

For a better understanding of the present invention, reference is made to the drawings which are incorporated herein by reference and in which.

DETAILED DESCRIPTION

Figure 1:
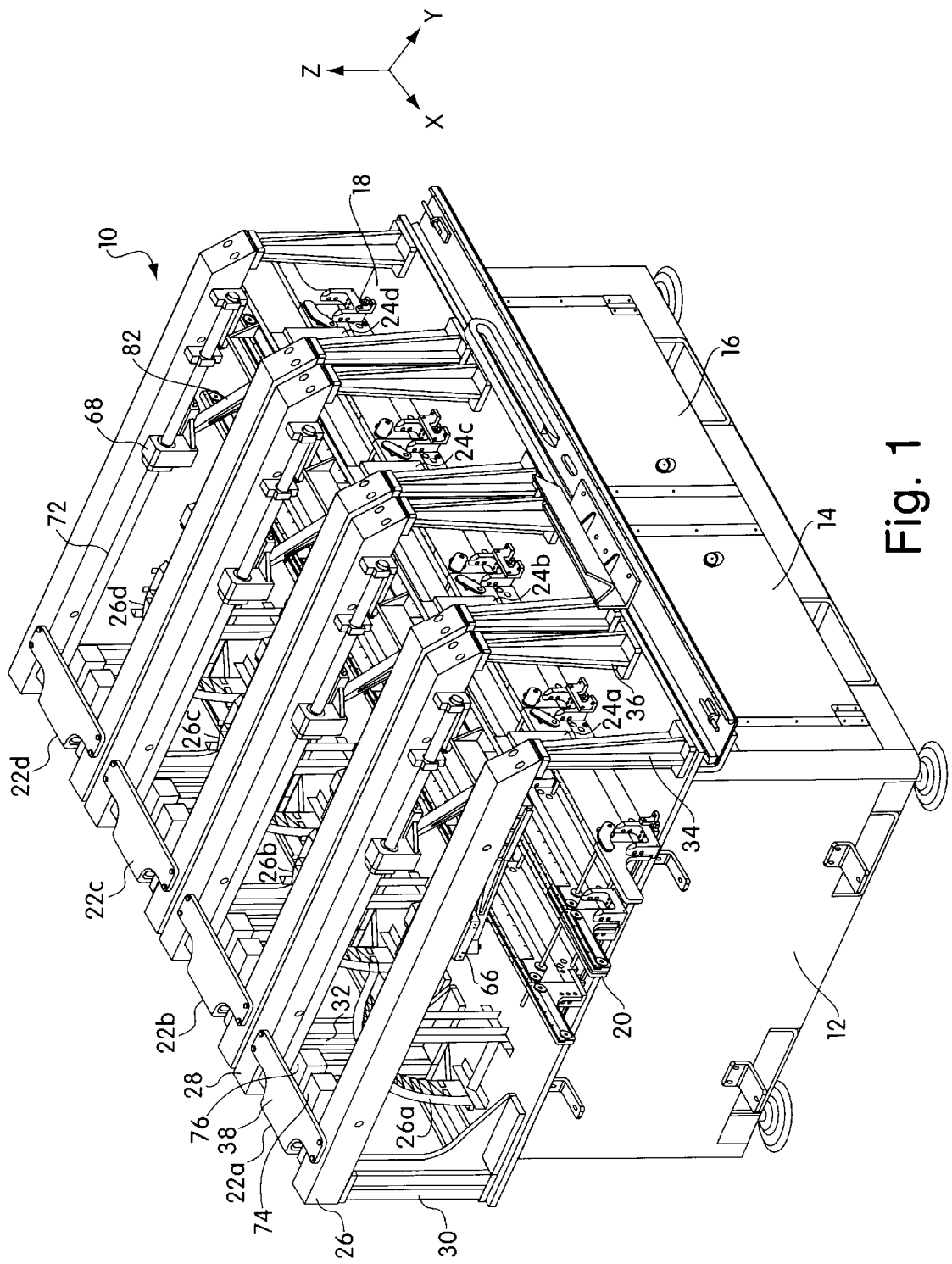
FIG. 1 is a perspective view of a multiple head dispensing system in accordance with one embodiment of the present invention.

For purposes of illustration, embodiments of the present invention will now be described with reference to dispensing units designed for use with a multiple head dispensing system 10, shown in FIG. 1 and described below and in co-pending U.S. patent applications Ser. No. 09/033,022, and Ser. No. 09/189,014, both of which are assigned to the assignee of the present application, Speedline Technologies, Inc. Those skilled in the art will appreciate that embodiments of the present invention are not limited for use with multiple head dispensing systems, but also may be used in single head applications as well.

The multiple head dispensing system 10 will now be described with reference to FIGS. 1 and 2. FIG. 1 shows a perspective view of a multiple head dispensing system 10, and FIG. 2 shows a top view of the dispensing system 10. For ease of illustration, the system is shown in FIGS. 1 and 2 without an outer covering.

The dispensing system 10 includes a lower compartment 12 that is used to house electrical and pneumatic controllers and a primary system controller. Access doors 14 and 16 are mounted on the front of the lower compartment to provide access to the equipment contained therein. The top of the lower compartment forms a work surface 18 on which a dual track conveyor 20 resides. Mounted to the work surface 18 are four x/y gantry systems 22a, 22b, 22c and 22d. Each of the gantry systems supports a dispensing head 24a, 24b, 24c and 24d which dispenses material onto substrates loaded into the dispensing system using the conveyor system 20, and in addition, in some embodiments of the present invention, each of the gantry systems supports a camera used as part of a vision system alignment and inspection system. The work surface 18 has four holes through which four cable troughs 26a, 26b, 26c and 26d pass. Each of the cable troughs are used to run cables from the control electronics and pneumatics in the lower compartment to each of the dispensing heads 24a, 24b, 24c and 24d. In one embodiment, the cable troughs are implemented using an E-Chain available from Igus Corporation.

The gantry systems 22a, 22b, 22c and 22d are substantially identical and in one embodiment are implemented using one of the gantry systems disclosed in either U.S. patent application Ser. No. 08/967,682, U.S. Pat. No. 5,886, 494 entitled "Positioning System", or in U.S. patent application Ser. No. 08/796,026, abandoned also entitled "Positioning System", filed Feb. 6, 1997, both of which are incorporated herein by reference. Gantry system 22a will now be described in greater detail with reference to FIGS. 1 and 2, it being understood that gantry systems 22b, 22c and 22d are substantially identical to gantry system 22a. Gantry system 22a provides positioning of the dispensing head 24a along the horizontal, orthogonal x and axes shown in FIG. 1.

Gantry system 22a includes two horizontal support members 26 and 28 and four vertical support members 30, 32, 34 and 36 coupled to the work surface 18. A motor support plate 38 is coupled between the horizontal support members and is used to support two motors 74 and 76. The gantry 22a also includes a plate 50 that is slidably mounted to rails (not shown) disposed on the under side of each of the horizontal support members so that the plate can move along the y-axis. Dispensing head or pump 24a is mounted to a carriage 60 which in turn is slidably mounted to the plate 50 to permit movement of the dispensing head along the x-axis.

Gantry system 22a further includes two nut blocks 66 and 68 that are slidably movable along the rails mounted under the horizontal support members 26 and 28. Each of the nut blocks is coupled to one of the motors 74, 76 through a respective lead screw 70, 72. The nut blocks can be separately driven by the motors using the lead screws to move the nut blocks along the y-axis. The dispensing head 24a is connected to each nut block 66, 68 with respective rigid trailing arms 80, 82 that are pivotally connected at one end to one of the nut blocks and at the other end to the dispensing head 24a. As explained in greater detail in U.S. patent application Ser. No. 08/796,026, the dispensing head 24a may be positioned along the x and y axes by moving the nut blocks along the y-axis using motors 74 and 76. Motors 74 and 76, as well as a z-axis motor located within the dispensing head 24a, are controlled by the primary system controller located in the lower compartment.

The gantry systems 22a, 22b, 22c and 22d provide a significant advantage in the dispensing system 10. As described in U.S. patent application Ser. No. 08/796,026, abandoned the ratio of the working area beneath the gantry system to the total width of the gantry system is much greater for the gantry systems described above than for typical x/y gantry systems. This reduces the time required to move a work product between work positions in the multiple head dispensing system, and also reduces the total footprint of the dispensing system 10.

The dispensing heads 24a, 24b, 24c and 24d may be implemented using a number of different dispensing heads or pumps including those disclosed in U.S. Pat. Nos. 5,819, 983 and in U.S. patent application Ser. No. 08/885,005, U.S. Pat. No. 5,957,343 each of which is incorporated herein by reference. In addition, the dispensing heads may be implemented using dispensing heads in accordance with embodiments of the present invention which are described below.

Figure 3:
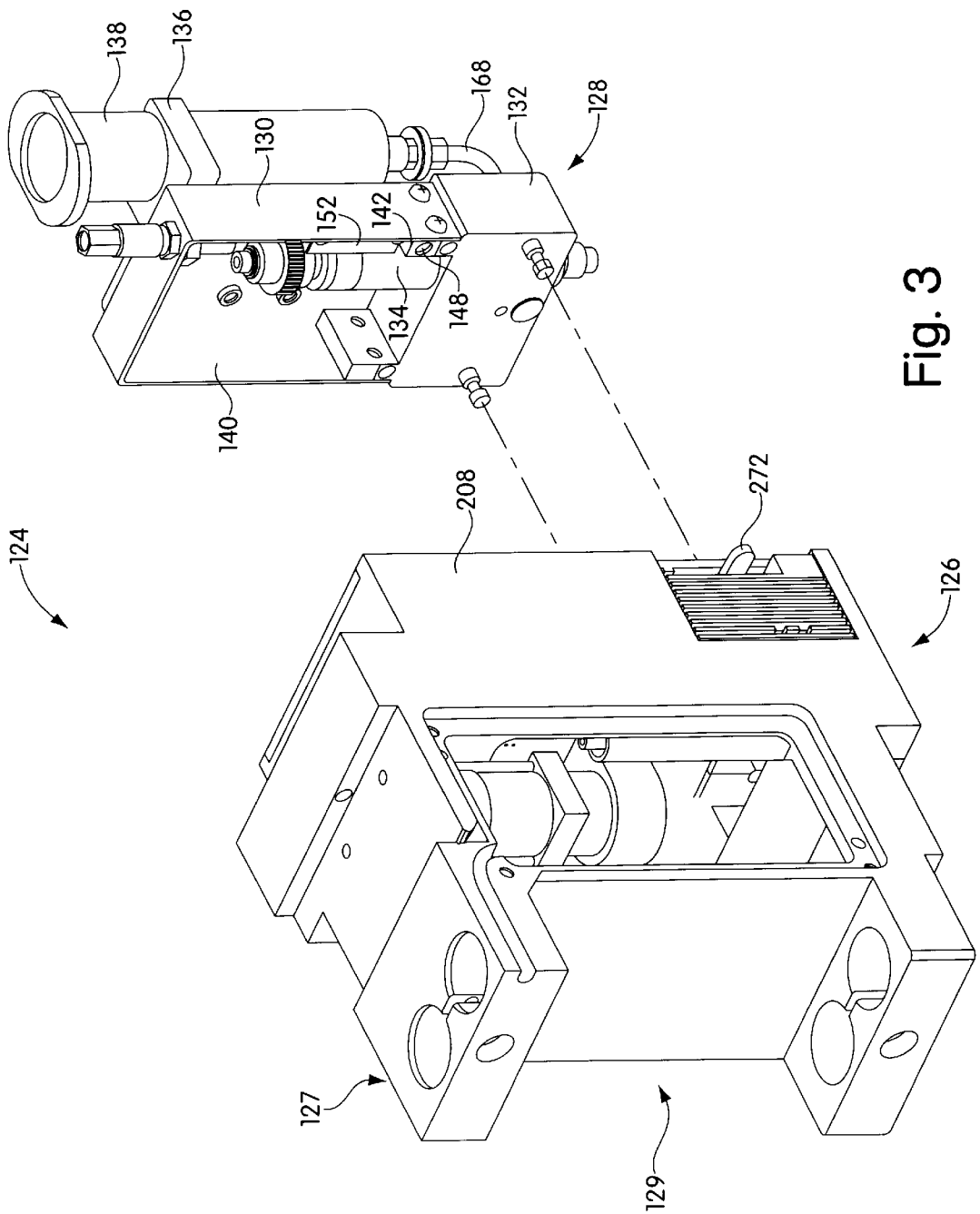
FIG. 3 is a first perspective view of a dispensing head in accordance with one embodiment of the present invention that may be used in the dispensing system of FIG. 1.
Figure 4:
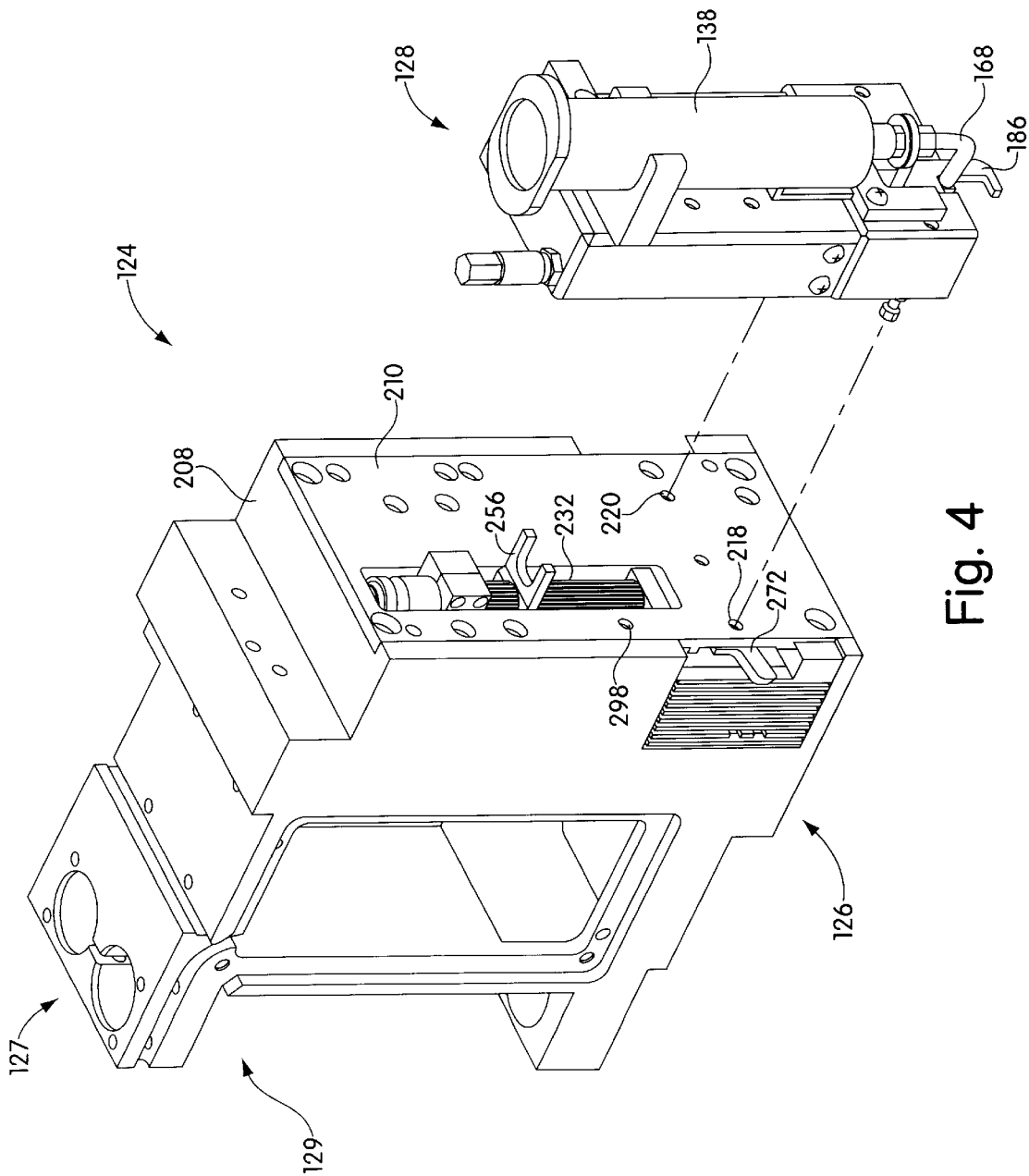
FIG. 4 is a second perspective view of the dispensing head of FIG. 3.

FIGS. 3 and 4 show perspective views of a dispensing head 124 in accordance with one embodiment of the present invention that may be mounted to one of the carriages 60 of the multiple head dispensing system 10. The dispensing head 124 includes a motor unit 126 and a dispensing unit 128. The motor unit has a mounting surface 129 for mounting to one of the carriages 60, and a yoke feature 127 for connecting to rigid trailing arms 80, 82. As shown in FIGS. 3 and 4, the dispensing unit 128 is removable from the motor unit. The dispensing head 124 is designed such that all motors of the dispensing head are contained within the motor unit and such that the dispensing material is contained only in the removable dispensing unit. Accordingly, when it is desired to change material being dispensed from the dispensing head 124 or to change the size of the needle from which material is dispensed, the dispensing unit may be removed from the motor unit and replaced with another dispensing unit having the desired material and/or needle size. As discussed below in detail, a kinematic connection is provided between the dispensing unit and the motor unit, to provide precise positioning of the dispensing needle of the dispensing unit without the need to recalibrate the dispensing head whenever a dispensing unit is replaced.

The dispensing unit 128 will now be described in greater detail with reference to FIGS. 3–6. The dispensing unit includes a main housing 130, a lower housing 132, a dispensing cartridge 134 and a syringe support 136 for supporting a syringe 138 of dispensing material. The main housing 130 has a cavity portion 140 containing the dispensing cartridge 134, a pneumatic terminal block 142 and a pneumatic line 144 coupled between the pneumatic terminal block 142 and a pneumatic port 146 mounted to the top of the main housing 130. The pneumatic terminal block has an inlet port 148 to receive pressurized air from the motor unit 126. The inlet port includes a resilient O-ring 156 that provides a seal for the pneumatic connection between the motor unit and the dispensing unit. The pneumatic port 146 is coupled to a top cap (not shown) of the syringe 138 through an air hose 154 (shown in FIG. 6). During operation of the dispensing unit, the pressurized air is used to pressurize the material in the syringe to cause the material to flow from the syringe into the dispensing cartridge.

Figure 6:
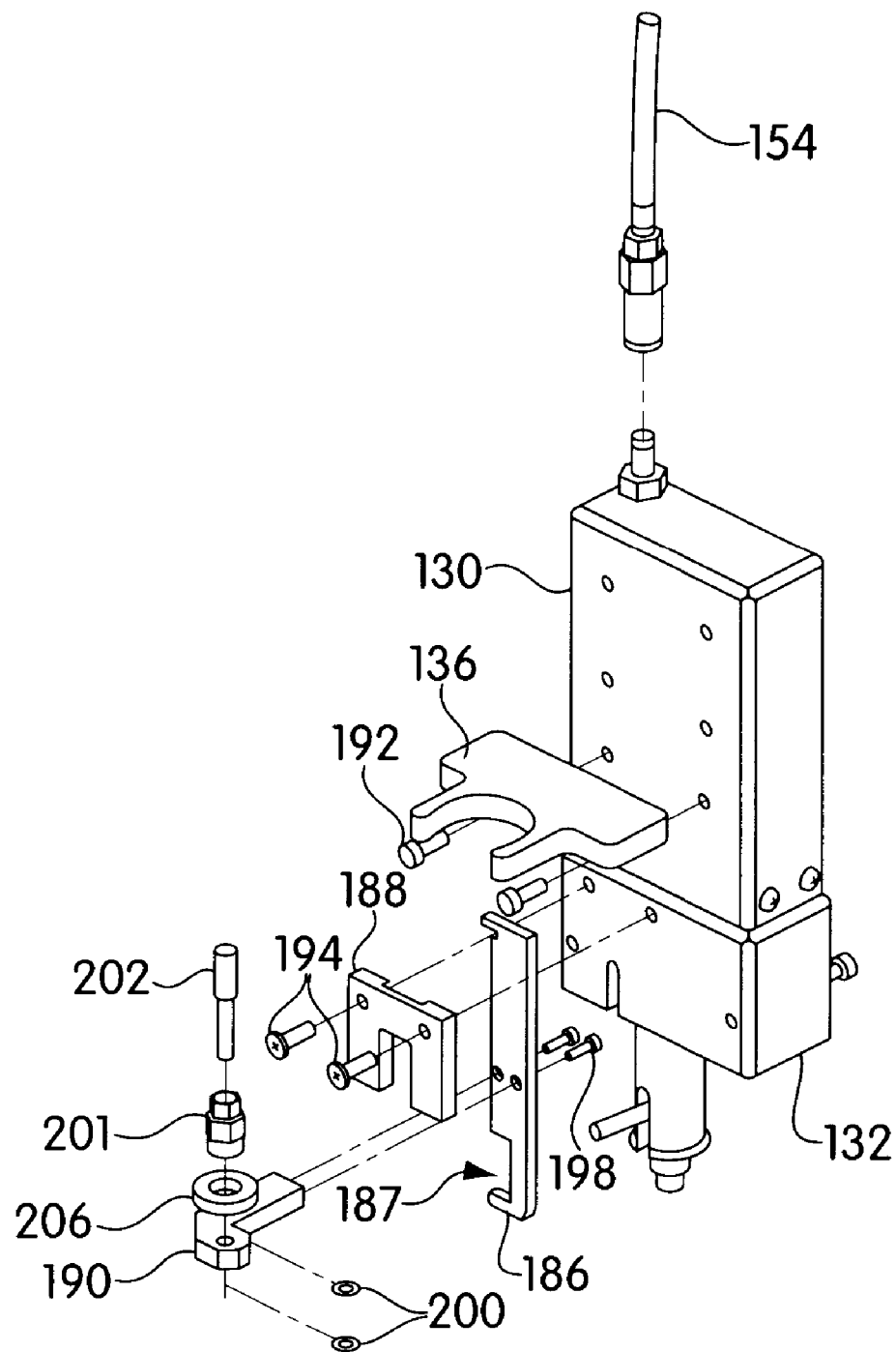
FIG. 6 is a second exploded view of the dispensing unit shown in FIG. 5.

The pneumatic terminal block 142 has a circuit board bracket 150 upon which a small circuit board 152 is mounted. In FIG. 6, the circuit board bracket 150 is shown with the circuit board removed. As described below in greater detail, the circuit board provides electrical connections that allow the motor unit to identify a dispensing unit coupled to it, and in one embodiment, the circuit board allows the motor unit to provide electrical power to a heater in a dispensing unit. In this embodiment, the circuit board further provides electrical connections between the motor unit and temperature sensors located within the dispensing unit.

The lower housing 132 of the dispensing unit has a cylindrical hole 159 for containing the dispensing cartridge. The lower housing also has two alignment pins 174, 176 and three raised cylindrical tabs 178, 180, 182 that are used to achieve the kinematic mounting of the dispensing unit to the motor unit. The alignment pins are coupled to the housing using two screws 184.

Figure 5:
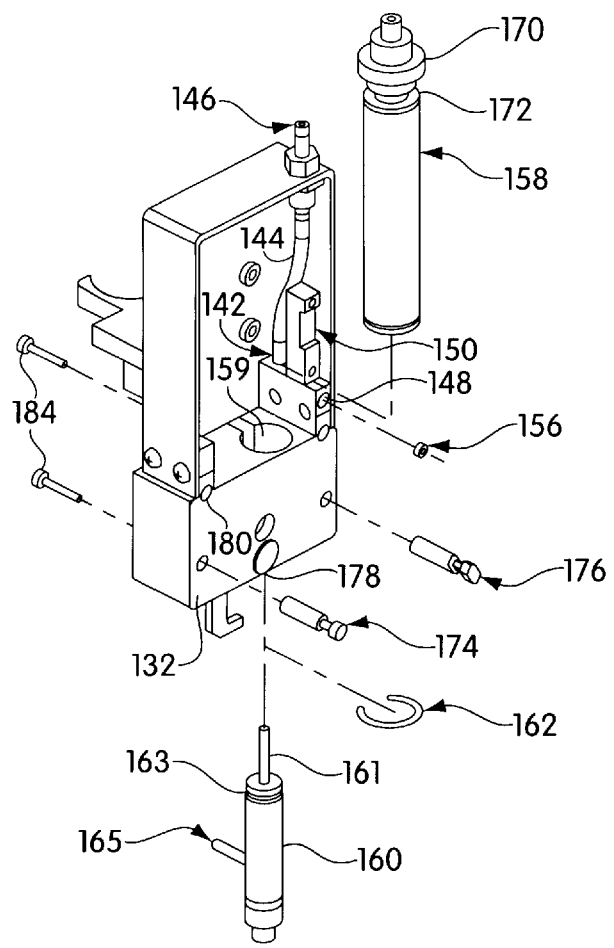
FIG. 5 is a first exploded view of a first embodiment of a dispensing unit used in the dispensing head of FIG. 3.

As shown in FIG. 5, the dispensing cartridge includes a cartridge sleeve 158 and a lower cartridge 160 having a shaft 161. The cartridge sleeve is inserted into the lower housing 132 and is retained in the lower housing using retaining ring 162. The lower cartridge is inserted into the cartridge sleeve and is retained in the cartridge sleeve using tension created by a resilient ring (not shown) disposed in a groove 161 of the lower cartridge. The lower cartridge has an inlet port 166 for receiving dispensing material from the syringe 138 through a hose 168. One of a number of dispensing needles of different sizes may be coupled to the bottom of the lower cartridge depending on the volume and type of material being dispensed. The cartridge sleeve 158 has a gear 170 designed to mate with the elongated gear 232 of the motor unit as described further below. The gear also engages shaft 161 when the lower cartridge is inserted into the cartridge sleeve. The cartridge sleeve also includes a shoulder portion 172 which mates with the lift plate 256 of the motor unit. The lift plate 256 controls vertical movement of the dispensing cartridge within the cylindrical hole 159.

FIG. 6 shows the side of the dispensing unit 128 containing the syringe mounting assembly in greater detail. The primary components of the syringe mounting assembly includes a syringe support 136, a syringe slider plate 186, a syringe slider guide 188, and a syringe adapter plate 190. The syringe support is coupled to the main housing using two screws 192, and the syringe slider guide is coupled to the main housing using two screw 194. The syringe slider plate includes a slot 187 and is retained against the main housing using the syringe slider guide. As discussed below, the syringe slider plate can move vertically within the syringe slider guide. The syringe adapter plate is coupled to the slider plate using two screws 198. The syringe mounting assembly further includes two retainer rings 200, a syringe ferrule knob 206, a luer module fitting 204 and a syringe ferrule 202, which are used to couple the output of the syringe to the lower cartridge of the dispensing cartridge through the hose 168.

The motor unit 126 will now be described in greater detail with reference to FIGS. 3, 4, 7 and 8. The motor unit includes a motor unit housing 208 having a front plate assembly 209 with a mating surface 210 for mating with the dispensing unit. The mating surface 210 mates with the cylindrical tabs 178, 180 and 182 of the dispensing unit, and the mating surface 210 includes two alignment holes 218 and 220 for mating with the alignment pins 174 and 176 of the dispensing unit.

Figure 5A:
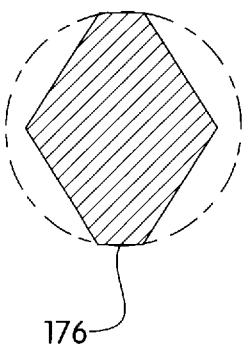
FIG. 5A is a cross-sectional view of an alignment pin used in embodiments of the present invention.

In one embodiment of the present invention in which it is desired to provide a kinematic connection between the motor unit and the dispensing unit, one of the alignment pins 174 has a circular cross-section and the other alignment pin 176 has a substantially diamond shaped cross-section as shown in FIG. 5A. As understood by those skilled in the art, a kinematic connection uniquely constrains the relative position of two objects being aligned along all six degrees of motion (X, Y, Z, pitch, yaw, roll). In embodiments of the present invention, the circular alignment pin 174 provides control for two degrees of motion, and the other alignment pin 176 and each of the cylindrical tabs 178, 180 and 182 provides control for one degree of motion. As discussed below, the use of the kinematic connection between the motor unit and the dispensing unit in embodiments of the present invention, makes it unnecessary to recalibrate the dispensing head when a dispensing unit is replaced.

Figure 7:
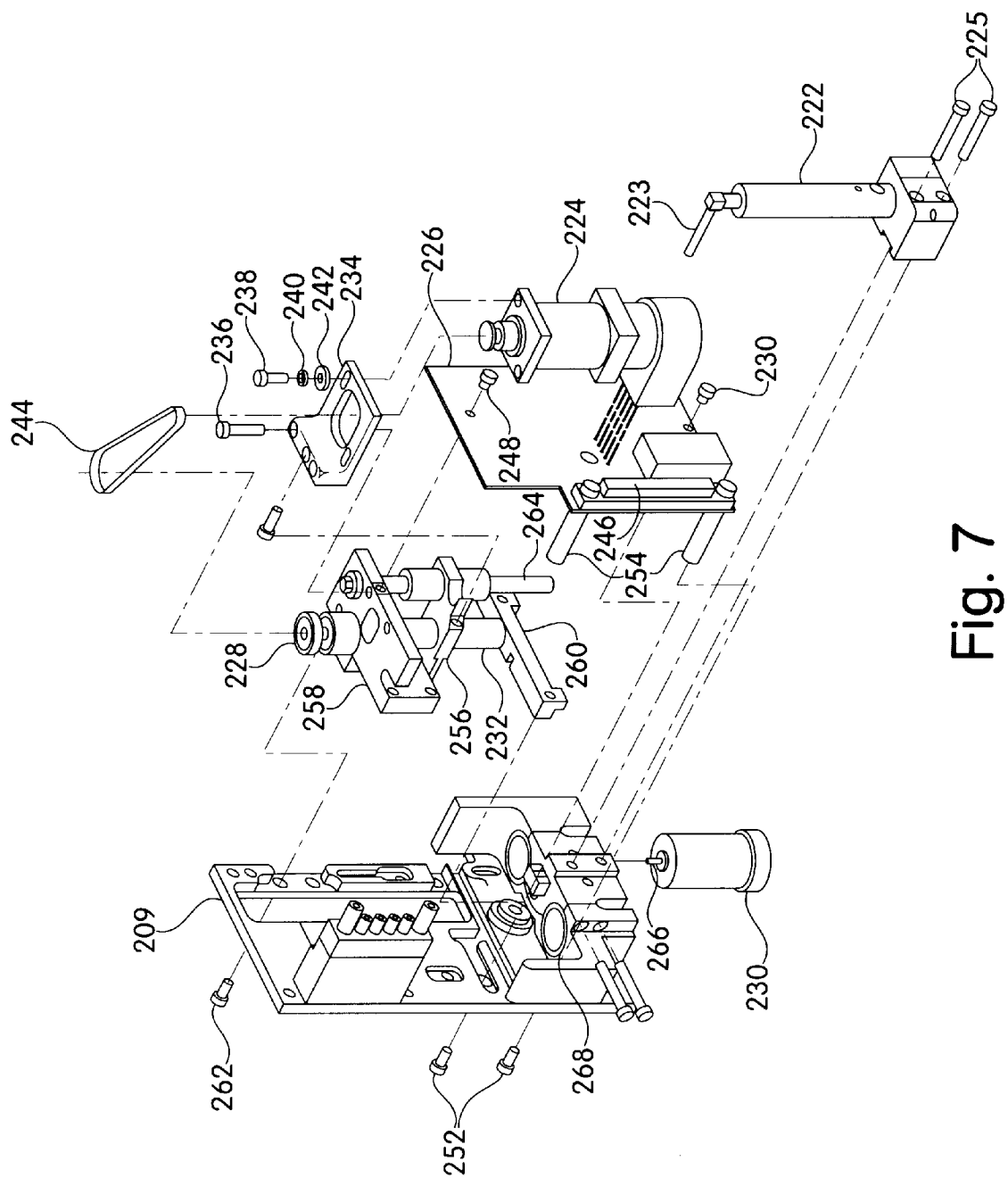
FIG. 7 is an exploded view of a motor unit used in the dispensing head of FIG. 3.

The major components of the motor unit that are coupled to the front plate assembly 209 are shown in greater detail in FIG. 7 and include a touch probe assembly 222, a dispense-drive motor assembly 224, a main circuit board 226, an output drive assembly 228, and a Z-axis motor assembly 230.

The touch probe assembly is coupled to the front plate assembly 209 using two screws 225. The touch probe assembly has an extendable pin on the bottom of the assembly that can be used to measure a distance between the motor unit and a substrate upon which dispensing is to occur. Extension of the pin is controlled using air pressure received through a pneumatic input 223 of the touch probe assembly 222. For some applications, it is desirable that the material outlet of the dispensing unit be a precise distance above the substrate, and for these applications, the touch probe can be used to measure the distance from the dispensing head to the substrate to aid in the proper positioning of the dispensing unit prior to dispensing. As discussed above, in some embodiments of the present invention, a kinematic mounting is provided for the dispensing unit to the motor unit. Accordingly, for a given dispensing unit, and a given position of the lift plate, the outlet of the needle of the dispensing unit is at a fixed position relative to the motor unit, and given knowledge of this fixed position, and the distance measured by the touch probe assembly, the controller of the dispensing system can position the outlet of the needle at the proper dispensing height.

In one embodiment of the present invention, the touch probe assembly is implemented using one of the touch probes described in U.S. patent application Ser. No. 08/803,994 U.S. Pat. No. 6,093,251 entitled "Method and Apparatus for Measuring the Height of a Substrate in a Dispensing System" by Carr et al, assigned to the assignee of the present invention, and incorporated herein by reference.

The dispense drive motor 224 is used to control rotational movement of the elongated gear 232 and hence, control the dispensing of material by the dispensing cartridge 134. The dispense-drive motor is coupled to the main circuit board 226 to receive power and control signals, and is mounted to a Z-motor bracket 234 using screws 236, 238 and washers 240, 242. A drive belt 244 is used to couple the output drive shaft of the dispense drive motor to the elongated gear 232. In one embodiment, the dispense drive motor is implemented using a brushless motor, series IBH-101 available from QMC of New Ulm, Minn.

The main circuit board assembly 226 is mounted to the front plate assembly 209 using screws 248, 250, 252 and screw posts 254. The main circuit board assembly 226 provides the primary electrical interface and electrical distribution functions for the dispensing head. An electrical connector 246 mounted on the circuit board assembly provides the electrical interface to other components of the dispensing system.

The motor drive assembly 228 includes the lift plate 256, the elongated gear 232, an upper mounting bracket 258 and a lower mounting bracket 260. The upper mounting bracket and the lower mounting bracket are used to mount the motor drive assembly to the front plate assembly 209 using four screws 262 (only one of which is shown in FIG. 7). The motor drive plate also includes a ball screw 264 mounted to the upper mounting bracket 258 and the lift plate 256, such that rotation of the ball screw causes vertical movement of the lift plate 256 and vertical movement of the dispensing cartridge 134.

The Z-axis motor is positioned above a Z-axis motor connector 268 on the front plate assembly that provides power and control signals to the Z-axis motor. The Z-axis motor has an output drive shaft 266 that couples to the ball screw 264 to control movement of the lift plate 256. In one embodiment, the Z-axis motor is implemented using a brushless motor, model 2036 available from Micro-Mo Electronics of Clearwater, Fla.

Figure 8:
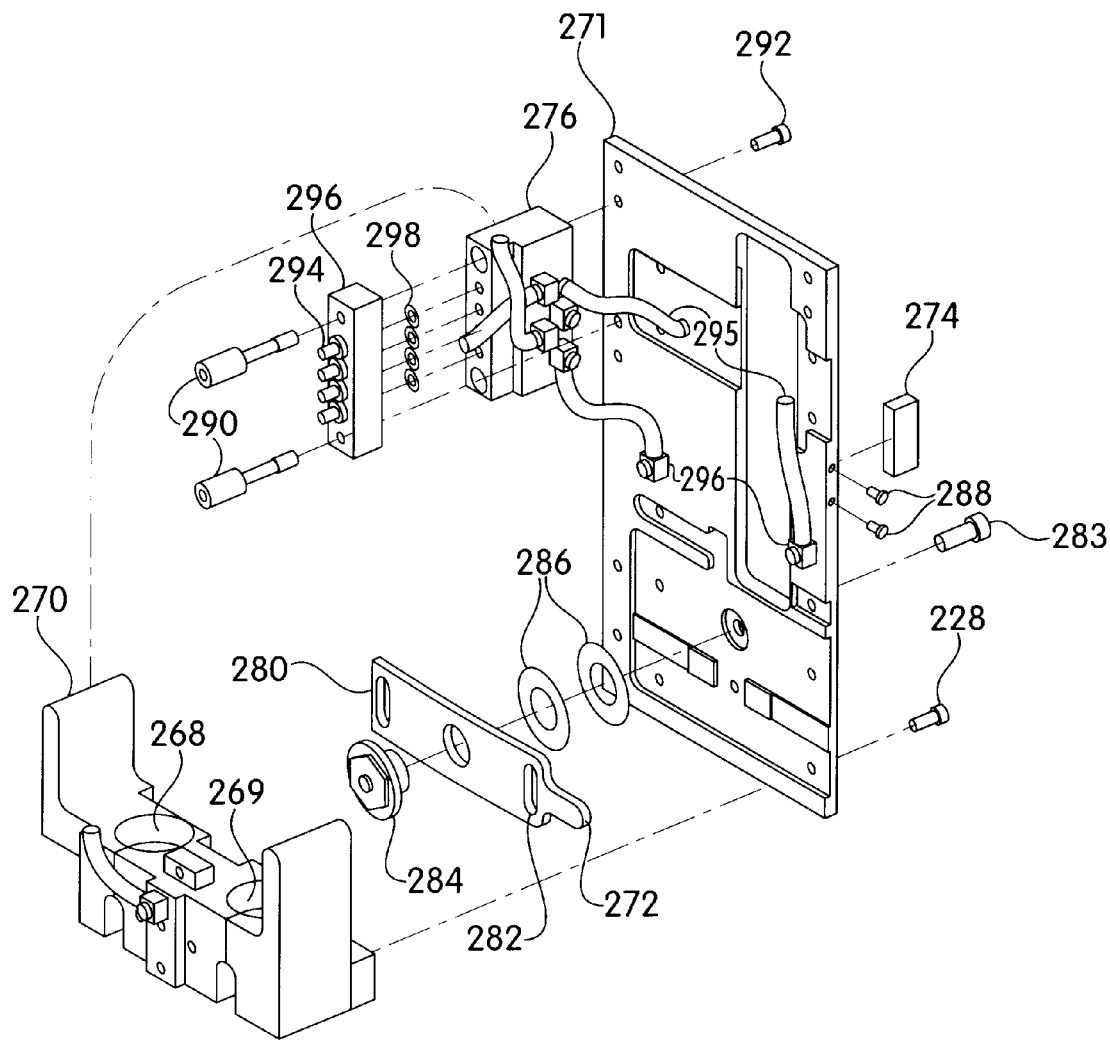
FIG. 8 is an exploded view of a front plate assembly used in the motor unit of FIG. 7.

The components contained within the front plate assembly 209 will now be described further with reference to FIG. 8. The major components of the front plate assembly include a front plate 271, a Z-axis motor bearing bracket 270, a locking plate 272, a pin probe assembly 274 and a pneumatic manifold head 276. The Z-axis motor bearing bracket contains the Z-motor connector 268 described above, and is mounted to the front plate using two screws 278 (only one of which is shown in FIG. 8). The Z-axis motor bearing bracket includes a second Z-motor connector 269 for an optional second Z-axis motor (not shown) to accommodate a dispensing unit having two independently controllable dispensing cartridges.

The locking cam plate 272 is used to lock the dispensing unit to the motor unit. The locking plate is moveable between a locked position and an unlocked position, and has two openings 280, 282 through which the aligning pins 174 and 176 penetrate when the dispensing unit is coupled to the motor unit. The locking cam plate is coupled to the front plate 271 using a pivot screw 283, nut 284 and two curved washers 286. Each of the curved washers is mounted such that the concave side of the washer faces the front plate.

The pin probe assembly 274 provides electrical connection between the motor unit and the circuit board 152 of the dispensing unit. The pin probe assembly is mounted to the front plate using two screws 288. In one embodiment, the pin probe includes a spring-loaded contact array part no. P294-03-314-50, available from Mill-Max of Oyster Bay, N.Y. In this embodiment, the spring-loaded pins contact conductive pads of the circuit board in the dispensing unit when the dispensing unit is coupled to the motor unit to provide electrical connections between the motor unit and the dispensing unit.

The pneumatic manifold head 276 provides the interconnection between components of the dispensing head that utilize pressurized air in their operation and pressurized air sources and controllers of the dispensing system. The pneumatic manifold head is coupled to the front plate 271 using two jackscrews 290 and two screw 292 (only one of which is shown in FIG. 8). The pneumatic manifold head includes a pneumatic connector 296 having four barbed pneumatic fittings 294. Four O-rings 298 are disposed between the connector and the manifold head to provide an air tight seal. A first tube 295 and a second tube 296 are coupled between the pneumatic manifold head and the front plate 271. The first tube 295 couples to a pneumatic output port 298 on the front mating surface of the motor unit. The pneumatic output port 288 is designed to mate with inlet port 148 of the dispensing unit to provide pressurized air to the syringe of the dispensing unit. The second tube 296 is designed to mate with a second output port (not shown) on the front mating surface of the motor unit. The second output port, and additional output ports, may be used to provide pneumatic connections to support additional pneumatic components in other embodiments of the present invention as described below.

The operation of the dispensing head 124 will now be described. The dispensing unit 128 is aligned with the motor unit 126, mated with the motor unit and locked in place using locking plate 272. When the dispensing unit mates with the motor unit, the pin probe assembly 274 of the motor unit makes electrical contact with the circuit board 152 of the dispensing unit. In one embodiment, the dispensing head is able to detect the type of dispensing unit mated with it based on the resistance detected across contact pads on the circuit board. In this embodiment, different jumpers may be provided on the circuit board to identify dispensing unit characteristics such as the type of cartridge loaded into the dispensing unit and the type of material loaded into the dispensing cartridge.

In another embodiment, the circuit board includes a non-volatile data storage device such as a programmable read only memory. In this embodiment, the storage device may include additional characteristics of the dispensing unit including calibration data of the dispensing cartridge, remaining shelf life of the material in the dispensing cartridge, run-time of the dispensing unit and the size of the dispensing needle mounted to the cartridge. In some embodiments, data stored in the data storage device may be updated by the dispensing head. The calibration data stored in the storage device may include data regarding the position of the outlet of the dispensing needle. Because a kinematic mount is provided between the motor unit and the dispensing unit, this position data may be used to properly position the dispensing head for dispensing on a substrate. In some embodiments, the dispensing unit may be calibrated off line, not connected to the motor unit, and the calibration data may be stored in the storage device. Once the dispensing unit is mounted to the motor unit, little or no additional calibration may be required.

When the dispensing unit is mated with the motor unit, the elongated gear 232 of the motor unit couples with the gear 170 of the dispensing unit, the lift plate 256 couples with the shoulder 172 of the dispensing cartridge and the output pneumatic port 298 mates with the pneumatic inlet port 148.

To dispense material onto a substrate, the dispensing head 124 is first moved by the gantry system of the dispensing system to position the needle above the substrate. The touch probe assembly 222 may then be used to determine the distance between the dispensing head and the substrate. The dispensing cartridge 134 is then lowered toward the substrate by activating the Z-axis motor 230 to cause the lift plate 256 to be lowered. When the dispensing cartridge is lowered, the inlet 166 of the lower cartridge 160 causes the syringe slide plate 186, the syringe adapter plate 190 and the syringe to be lowered towards the substrate. In one embodiment of the present invention, the lower cartridge may include a spring-loaded stop that extends beyond the needle. The spring-loaded stop contacts the substrate to prevent further downward movement of the needle to accurately set the dispensing height of the needle.

Once the needle is at the proper dispensing height, the Z-drive motor is activated to cause the elongated gear 232 and the gear 170 to turn, thereby causing material to be dispensed. The use of the elongated gear allows the dispensing cartridge to be lowered while maintaining coupling between the elongated gear 232 and the gear 170.

In one embodiment of the present invention, preferably used for dispensing multiple dots of material, after one dot is dispensed at a first dispensing position, the lift plate is raised a relatively small amount causing the dispensing cartridge to be raised a small amount. The dispensing head is then moved to position the needle over a second dispensing position. When the dispensing cartridge is raised, the outlet 166 moves within the slot 187 of the slider plate 186. By keeping the distance that the dispensing cartridge is raised less than the length of the slot 187, the dispensing cartridge can be lifted without lifting the syringe. It is generally desirable to lift the needle when moving the dispensing head between dot dispensing positions to prevent the needle from contacting components or other protrusions on the substrate. In the embodiment of the present invention described above, the needle can be raised without raising the syringe providing less stress on the Z-axis motor.

In another embodiment of the present invention, preferably used for larger volumes of material, for example, lines of material, the syringe is fixed in place to the dispensing cartridge using a rigid metal tube in place of the hose 168, and the slider plate is not used. When the lifting plate lowers the dispensing cartridge, the syringe moves with the dispensing cartridge. The use of the rigid tube prevents changes in back pressure that may occur when a flexible hose is used. In addition, for some dispensing materials, it is desirable to heat the material prior to dispensing. For these materials, the metal tube may be heated to raise the temperature of the dispensing material.

In other embodiments of the present invention, for either the dot dispensing embodiment or the line dispensing embodiment discussed above, further vertical movement of the needle may be provided by moving the entire dispensing head 126 vertically using motors mounted to the gantry system of the dispensing system.

As discussed above, the dispensing cartridges used with embodiments of the present invention may include auger style pumps, and in some embodiments, the auger style pumps may include a shut off valve such as one of those described in U.S. Pat. No. 5,819,983. When a shut-off valve is used, an additional pneumatic connection may be provided between the motor unit and the dispensing unit to control the shut-off valve. In some embodiments of the present invention, when a fairly abrasive material, such as solder paste, is used in the dispensing unit, the shut-off valve may be controlled such that it does not completely close to prevent damage to the valve and the valve seat by solid particles contained in the dispensing material.

For some dispensing applications, it is desirable to maintain the material to be dispensed at an elevated temperature. To accommodate these applications, in some embodiments of the present invention, electrical heaters, such as those available from Merrimac of Haverhill, Mass. having part no. MTWA-250-1.25, are incorporated in the lower housing 132 of the dispensing unit. In these embodiments, temperature sensors may also be incorporated in the lower housing to monitor the temperature of the material. Electrical connections for the heaters and the temperature sensors may be provided through the pin probe assembly 274 and circuit board 152. In addition, to aid in the heating of the material, air may be passed over the heaters in the lower block housing. The air may be provided through an additional pneumatic connection between the motor unit and the dispensing unit.

Figure 9:
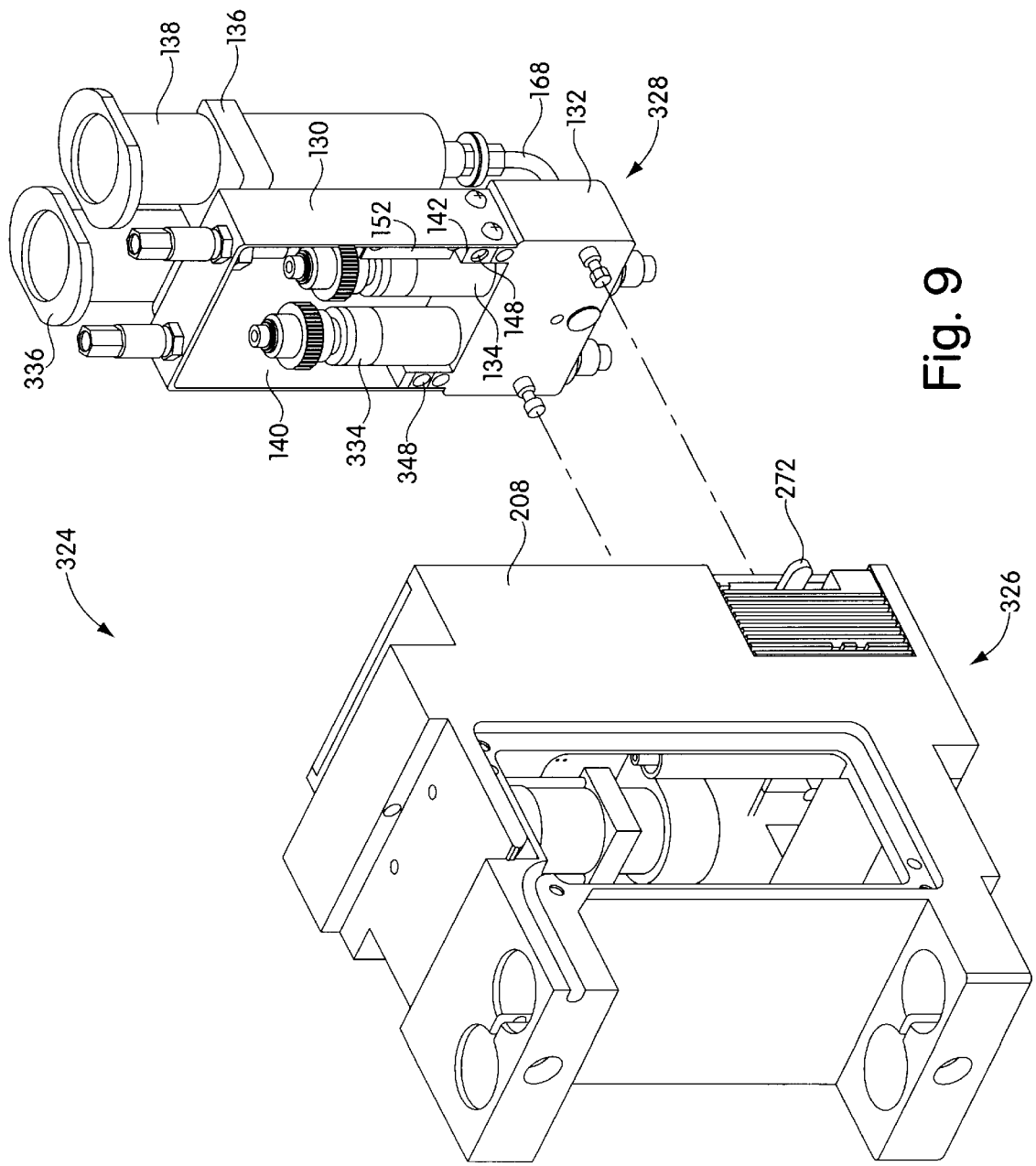
FIG. 9 is a first exploded view of a second embodiment of a dispensing unit used in the dispensing head of FIG. 3.
Figure 10:
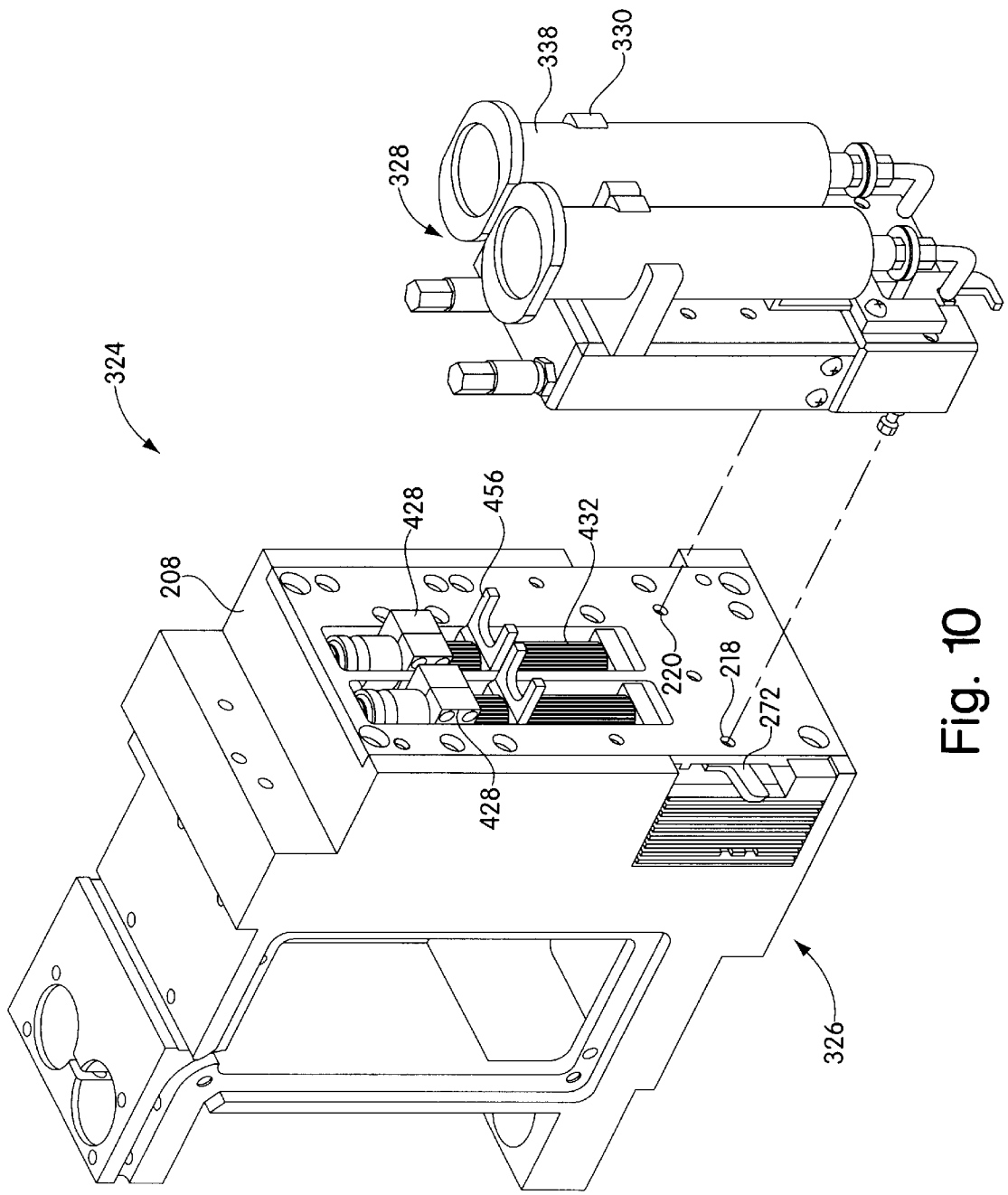
FIG. 10 is a second exploded view of the dispensing unit of FIG. 9.

Another embodiment of a dispensing head 324, having dual dispensing cartridges will now be described with reference to FIGS. 9 and 10. The dispensing head 324 is similar to dispensing head 124 with the exception that an additional dispensing cartridge and supporting components have been added. Common elements of the dispensing head 124 and the dispensing head 324 are labeled using the same reference numbers. The dispensing head 324 includes a motor unit 326 and a dispensing unit 328. The dispensing unit 328 includes, in addition to the components of the dispensing unit 128, a second dispensing cartridge 334, and a second syringe support 330 for supporting a second syringe 338. The dispensing unit also includes a second pneumatic input port 348 to receive pressurized air for pressurizing the material in the second syringe 338.

The motor unit 326 includes, in addition to the components of the motor unit 126, an additional Z-axis motor, an additional motor drive assembly 428 having a second elongated gear 432, an electromagnetic clutching device (not shown) for selectively engaging the dispense motor 224 to one of the two motor drive assemblies, and a second lift plate 456.

The dispensing head 324 operates in substantially the same manner as the dispensing head 124 discussed above, except that in dispensing head 324 dispensing may occur from either of the dispensing cartridges independently. In typical applications, the dispensing cartridges will be either of different types or contain different materials to provide additional flexibility to dispensing operations, and one of the two dispensing cartridges will be selected to perform a particular dispensing operation. For example, one of the dispensing cartridges may be a dot dispensing cartridge optimized to dispense dots, while the other cartridge may be a line dispensing cartridge optimized to dispense lines of material. Preferably, a dispensing cartridge not in use will be maintained in a raised position to prevent it from contacting any components mounted on the substrate. As understood by those skilled in the art, to accommodate special dispensing operations, in some embodiments, the two dispensing cartridges in the dispensing head 324 may be designed to be operated simultaneously.

In embodiments of dispensing heads discussed above, either one or two dispensing cartridges are contained in a dispensing unit. In other embodiments, to accommodate other applications, more than two dispensing cartridges could be used.

Figure 11:
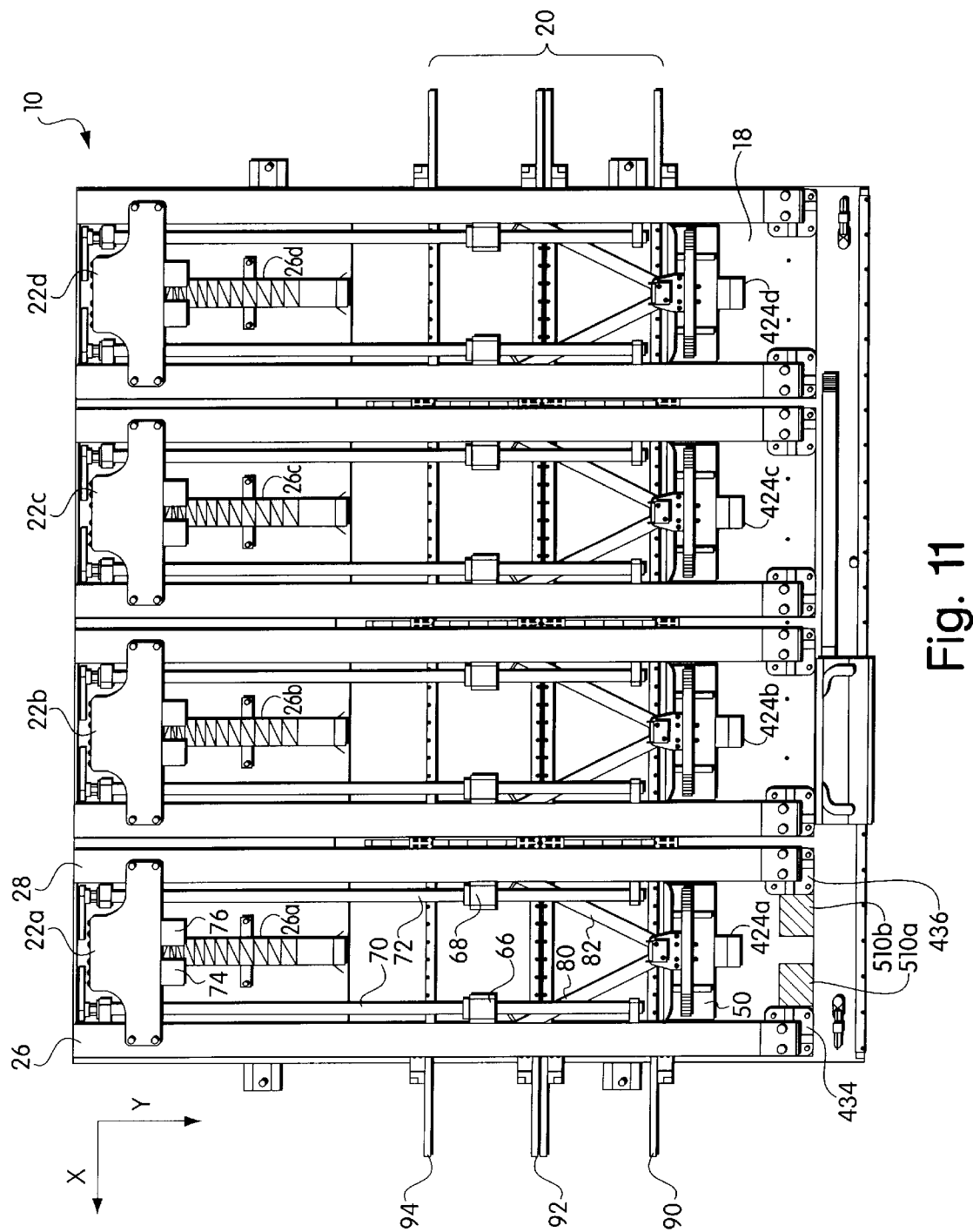
FIG. 11 is a second embodiment of a dispensing system of the present invention.

In the embodiments of the present invention discussed above, the dispensing units are mated with the motor unit manually. In other embodiments which will now be described with reference to FIG. 11, a dispensing system may automatically exchange dispensing units. FIG. 11 shows a top view of a four head dispensing system 410 that is similar to the dispensing system 10 described above with reference to FIG. 1. The dispensing system 410 includes four gantry systems 422a, 422b, 422c and 422d, each having a dispensing head 424a, 424b, 424c, and 424d implemented using one of the two-part dispensing heads of the present invention described herein. Attached to the front vertical supports 434, 436 of one of the gantry systems 422a, are dispensing unit holders 510a and 510b that may contain a number of dispensing units. As understood by those skilled in the art, although dispensing unit holders are shown for only gantry system 422a, additional dispensing unit holders could be provided for each of the other gantry systems 422b, 422c, and 422d.

The dispensing system 410 automatically replaces a dispensing unit of dispensing head 424a as follows. The gantry system 422a positions the dispensing head at the dispensing holder 510a. The dispensing head is then placed in an empty slot in the holder. The dispensing unit holder 510a may include a release mechanism that captures the locking plate to release the dispensing unit being replaced. Once the dispensing unit has been removed, the dispensing head is positioned at dispensing unit holder 510b to mate with a new dispensing unit contained therein. Dispensing unit holder 510b may include a locking mechanism that captures the locking plate to lock the new dispensing unit in place. The dispensing head may then be positioned over substrates to dispense material from the new dispensing unit.

In embodiments of dispensing systems of the present invention having dispensing unit holders, the dispensing units may be calibrated prior to being placed in the dispensing unit holder. The calibration data may then be stored in a data storage device in the dispensing unit. When the dispensing unit is mated with the motor unit, the calibration data can be read from the storage device, thereby obviating the need to perform a calibration routine each time a dispensing unit is replaced.

Figure 2:
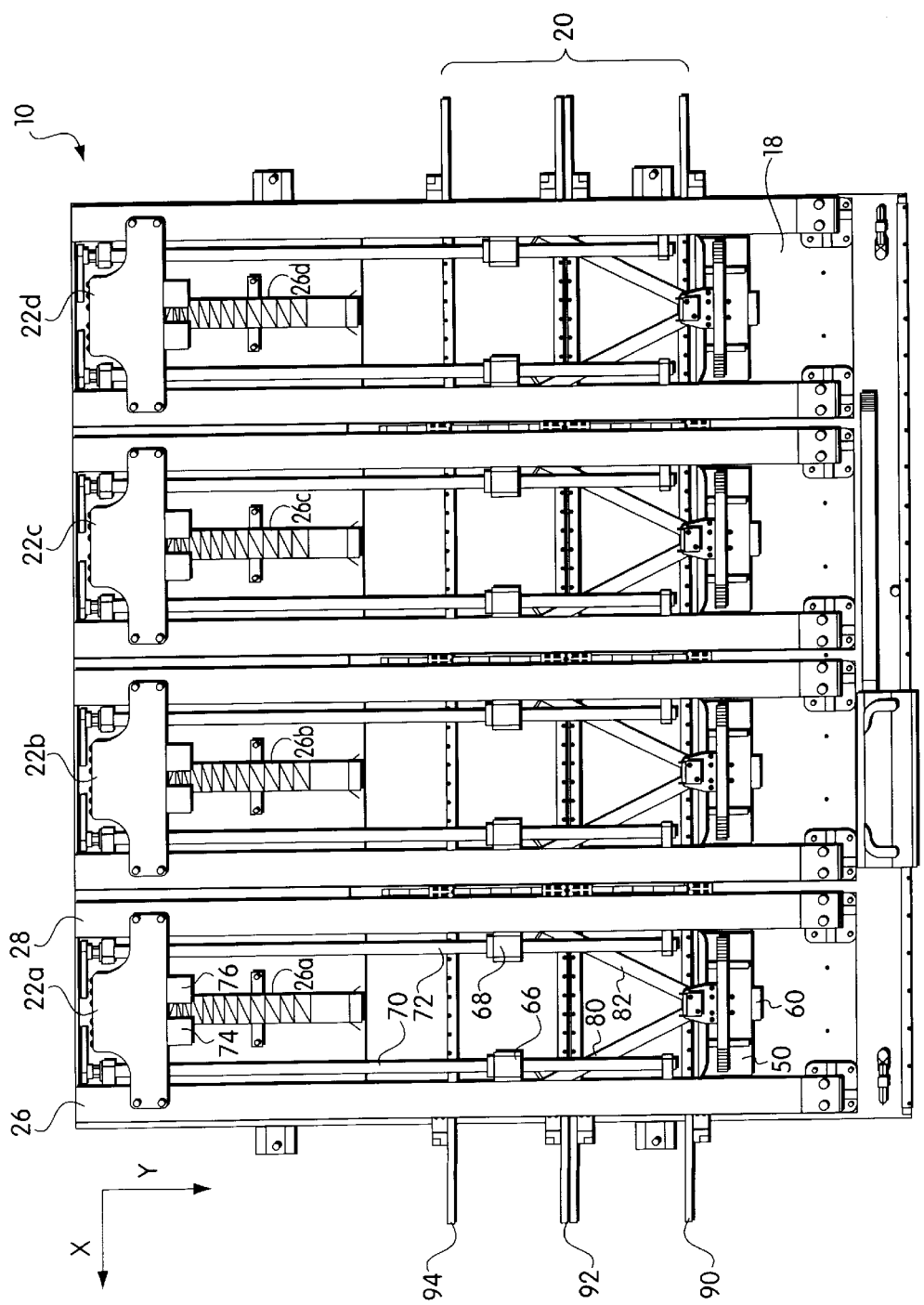
FIG. 2 is a top view of the dispensing system of FIG. 1.

Dispensing heads in accordance with the present invention have been described as being used with the multiple dispensing head dispensing system shown in FIG. 1. As understood by those skilled in the art, the dispensing heads of the present invention may also be used with other dispensing systems having one dispensing head or more than one dispensing head.

In dispensing units of embodiments of the present invention discussed above, gears are used to couple motors of the motor unit to dispensing cartridges of the dispensing units. In other embodiments, other mechanisms such as belts, drive shafts or other device can be used to couple the motors to the dispensing cartridges.

In embodiments of dispensing heads discussed above, the use of replaceable dispensing units greatly expands the flexibility of a dispensing system, by allowing dispensing units to be replaced without replacing an entire dispensing head. Further, since the dispensing units do not include motors, it is economical to maintain a large number of spare dispensing units having different characteristics.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting.

What is claimed is:

1. A dispensing system for dispensing material onto a substrate, the dispensing system comprising:
    a frame;
    a support, coupled to the frame, that supports the substrate at a dispensing position in the dispensing system; and
    a dispensing head, coupled to the frame, that dispenses the material onto the substrate, the dispensing head including:
        a motor unit having a first motor coupled to an output drive mechanism; and
        a dispensing unit, removably coupled to the motor unit, having a material outlet from which the dispensing material is dispensed, the dispensing unit having a dispensing mechanism coupled to the material outlet and coupled to the output drive mechanism of the motor unit such that operation of the first motor causes the dispensing mechanism to dispense material through the outlet.

2. The dispensing system of claim 1, wherein the motor unit further includes a second motor operatively coupled to a lift plate to provide vertical movement of the lift plate, and wherein the dispensing unit further includes an adapter that couples to the lift plate to provide vertical movement of the dispensing mechanism to lower the dispensing mechanism towards the substrate for dispensing.

3. The dispensing system of claim 2, wherein the output drive mechanism includes a first gear and the dispensing mechanism includes a second gear disposed to engage the first gear, and wherein the first gear has elongated teeth and the second gear is constructed and arranged to move vertically when the dispensing mechanism is lowered while maintaining engagement with the elongated teeth of the first gear.

4. The dispensing system of claim 3, wherein the dispensing unit and the motor unit are constructed and arranged to provide kinematic mating between the dispensing unit and the motor unit.

5. The dispensing system of claim 4, wherein the dispensing unit includes a plurality of electrical contacts, and wherein the motor unit includes a plurality of electrical contacts for operatively coupling to the electrical contacts of the dispensing unit.

6. The dispensing system of claim 5, wherein the dispensing unit includes electrical identification circuitry coupled to the plurality of electrical contacts that provides identification of characteristics of the dispensing unit.

7. The dispensing system of claim 6, wherein the electrical identification circuitry includes a data storage element containing calibration data for the dispensing unit.

8. The dispensing system of claim 7, wherein the dispensing unit includes an inlet pneumatic port and the motor unit includes an output pneumatic port that mates with the inlet pneumatic port of the dispensing unit to provide pressurized air to the dispensing unit.

9. The dispensing system of claim 8, wherein the dispensing unit includes a syringe coupled to the dispensing mechanism to provide dispensing material to the dispensing mechanism, and wherein the syringe is constructed and arranged to move vertically when the dispensing mechanism is lowered.

10. The dispensing system of claim 9, wherein the dispensing system is constructed and arranged such that the dispensing mechanism can be moved vertically over a range of movement, and wherein over at least a portion of the range of movement, the syringe does not move with the dispensing mechanism.

11. The dispensing system of claim 10, wherein the motor unit further includes a second output drive mechanism and the dispensing unit further includes a second dispensing mechanism.

12. The dispensing system of claim 1, wherein the dispensing unit and the motor unit are constructed and arranged to provide kinematic mating between the dispensing unit and the motor unit.

13. The dispensing system of claim 1, wherein the dispensing unit includes a plurality of electrical contacts, and wherein the motor unit includes a plurality of electrical contacts for operatively coupling to the electrical contacts of the dispensing unit.

14. The dispensing system of claim 13, wherein the dispensing unit includes electrical identification circuitry coupled to the plurality of electrical contacts that provides identification of characteristics of the dispensing unit.

15. The dispensing system of claim 14, wherein the electrical identification circuitry includes a data storage element containing calibration data for the dispensing unit.

16. The dispensing system of claim 1, wherein the dispensing unit includes an inlet pneumatic port and the motor unit includes an output pneumatic port that mates with the inlet pneumatic port of the dispensing unit to provide pressurized air to the dispensing unit.

17. The dispensing system of claim 1, wherein the dispensing unit includes a syringe coupled to the dispensing mechanism to provide dispensing material to the dispensing mechanism, and wherein the syringe is constructed and arranged to move vertically when the dispensing mechanism is lowered.

18. The dispensing system of claim 17, wherein the dispensing system is constructed and arranged such that the dispensing mechanism can be moved vertically over a range of movement, and wherein over at least a portion of the range of movement, the syringe does not move with the dispensing mechanism.

19. A dispensing system for dispensing material onto a substrate, the dispensing system comprising:
    a frame;
    a support, coupled to the frame, that supports the substrate at a dispensing position in the dispensing system; and
    a dispensing head, coupled to the frame, that dispenses the material onto the substrate, the dispensing head including:

a motor unit having a motor coupled to an output drive mechanism;

a dispensing unit having a material outlet from which the material is dispensed, the dispensing unit having a dispensing mechanism coupled to the material outlet; and means for removably coupling the motor unit to the dispensing unit such that operation of the motor causes the dispensing mechanism to dispense material through the outlet.

20. The dispensing system of claim 19, further comprising means for vertically moving the dispensing mechanism toward the substrate while maintaining the motor unit and the dispensing unit in a fixed position.

21. The dispensing system of claim 20, wherein the dispensing head further includes means for providing a kinematic coupling between the motor unit and the dispensing unit.

22. The dispensing system of claim 21, wherein the dispensing head further includes means for detecting characteristics of the dispensing unit.

23. The dispensing system of claim 22, wherein the means for detecting characteristics includes means for detecting calibration data of the dispensing unit.

24. The dispensing system of claim 19, wherein the dispensing head further includes means for providing a kinematic coupling between the motor unit and the dispensing unit.

25. The dispensing system of claim 19, wherein the dispensing head further includes means for detecting characteristics of the dispensing unit.

26. The dispensing system of claim 19, wherein the means for detecting characteristics includes means for detecting calibration data of the dispensing unit.

* * * * *